United States Patent
Allen et al.

(10) Patent No.: US 7,560,387 B2
(45) Date of Patent: Jul. 14, 2009

(54) OPENING HARD MASK AND SOI SUBSTRATE IN SINGLE PROCESS CHAMBER

(75) Inventors: Scott D. Allen, Dumont, NJ (US); Kangguo Cheng, Beacon, NY (US); Xi Li, Somers, NY (US); Kevin R. Winstel, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 603 days.

(21) Appl. No.: 11/275,707

(22) Filed: Jan. 25, 2006

(65) Prior Publication Data

US 2007/0173067 A1   Jul. 26, 2007

(51) Int. Cl.
*H01L 21/311* (2006.01)

(52) U.S. Cl. ............... 438/702; 438/719; 438/723; 438/724; 257/E21.002

(58) Field of Classification Search ............ 438/702, 438/719, 723, 724
See application file for complete search history.

(56) References Cited

U.S. PATENT DOCUMENTS

| | | | |
|---|---|---|---|
| 6,020,091 A * | 2/2000 | Lee | 430/5 |
| 6,746,961 B2 * | 6/2004 | Ni et al. | 438/700 |
| 6,890,859 B1 * | 5/2005 | Bamnolker et al. | 438/700 |
| 6,905,800 B1 * | 6/2005 | Yuen et al. | 430/5 |
| 6,949,203 B2 * | 9/2005 | Hsieh et al. | 216/67 |

\* cited by examiner

*Primary Examiner*—N Drew Richards
*Assistant Examiner*—Christy L Novacek
(74) *Attorney, Agent, or Firm*—Joseph Petrokaitis; Hoffman Warnick LLC

(57) ABSTRACT

Methods for opening a hard mask and a silicon-on-insulator substrate in a single process chamber are disclosed. In one embodiment, the method includes patterning a photoresist over a stack including an anti-reflective coating (ARC) layer, a silicon dioxide ($SiO_2$) based hard mask layer, a silicon nitride pad layer, a silicon dioxide ($SiO_2$) pad layer and the SOI substrate, wherein the SOI substrate includes a silicon-on-insulator layer and a buried silicon dioxide ($SiO_2$) layer; and in a single process chamber: opening the ARC layer; etching the silicon dioxide ($SiO_2$) based hard mask layer; etching the silicon nitride pad layer; etching the silicon dioxide ($SiO_2$) pad layer; and etching the SOI substrate. Etching all layers in a single chamber reduces the turn-around-time, lowers the process cost, facilitates process control and/or improve a trench profile.

19 Claims, 6 Drawing Sheets

OPENING HARD MASK AND SOI SUBSTRATE IN SINGLE PROCESS CHAMBER

BACKGROUND OF THE INVENTION

1. Technical Field

The invention relates generally to etching methods, and more particularly, to methods for opening a hard mask and a silicon-on-insulator (SOI) substrate in a single process chamber.

2. Background Art

Silicon-on-insulator (SOI) substrates are increasingly used with trenches for structures, such as trench capacitors, to provide further improvement of semiconductor device performance. However, forming trenches in an SOI substrate presents a number of challenges. For example, SOI substrate trenches require etching multiple layers including a silicon dioxide ($SiO_2$) based hard mask, a silicon nitride ($Si_3N_4$) pad layer, a silicon dioxide ($SiO_2$) pad layer, and the silicon-on-insulator (SOI) layer and a buried silicon dioxide ($SiO_2$) (BOX) layer of the SOI substrate. Because each etch chamber is conventionally designed and optimized to etch a specific material, etching multiple layers usually requires multiple etch process steps performed in multiple chambers in order to achieve a desired trench profile. For example, etching the SOI substrate requires use of another process chamber. Transferring wafers from one chamber to another increases the time required to complete the process. In addition, multiple chambers increase equipment expense. The above-described processes also may result in non-uniform SOI openings across an entire wafer, consumption of photoresist prior to etching of the BOX layer, and inadequate profile control. There is therefore a need in the art for a solution to the problems of the related art.

SUMMARY OF THE INVENTION

Methods for opening a hard mask and a silicon-on-insulator (SOI) substrate in a single process chamber are disclosed. In one embodiment, the method includes patterning a photoresist over a stack including an anti-reflective coating (ARC) layer, a silicon dioxide ($SiO_2$) based hard mask layer, a silicon nitride pad layer, a silicon dioxide ($SiO_2$) pad layer and the SOI substrate, wherein the SOI substrate includes a silicon-on-insulator a layer and a buried silicon dioxide ($SiO_2$) layer; and in a single process chamber: opening the ARC layer; etching the silicon dioxide ($SiO_2$) based hard mask layer; etching the silicon nitride pad layer; etching the silicon dioxide ($SiO_2$) pad layer; and etching the SOI substrate using an etch chemistry including nitrogen ($N_2$). Etching all layers in a single chamber reduces the turn-around-time, lowers the process cost, facilitates process control and/or improves trench profile.

A first aspect of the invention provides a method of opening a hard mask and a silicon-on-insulator (SOI) substrate, the method comprising the steps of: patterning a photoresist over a stack including an anti-reflective coating (ARC) layer, a silicon dioxide ($SiO_2$) based hard mask layer, a silicon nitride pad layer, a silicon dioxide ($SiO_2$) pad layer and the SOI substrate, wherein the SOI substrate includes a silicon-on-insulator (SOI) layer and a buried silicon dioxide ($SiO_2$) layer; and in a single process chamber: opening the ARC layer; etching the silicon dioxide ($SiO_2$) based hard mask layer; etching the silicon nitride pad layer; etching the silicon dioxide ($SiO_2$) pad layer; and etching the SOI substrate.

A second aspect of the invention provides a method of opening a hard mask and a silicon-on-insulator (SOI) substrate, the method comprising the steps of: patterning a photoresist over a stack including an anti-reflective coating (ARC) layer, a silicon dioxide ($SiO_2$) based hard mask layer, a silicon nitride pad layer, a silicon dioxide ($SiO_2$) pad layer and the SOI substrate, wherein the SOI substrate includes a silicon-on-insulator (SOI) layer and a buried silicon dioxide ($SiO_2$) layer; and in a single process chamber: opening the ARC layer; etching the silicon dioxide ($SiO_2$) based hard mask layer; etching the silicon nitride pad layer; etching the silicon dioxide ($SiO_2$) pad layer; and etching the SOI substrate using an etch chemistry including: approximately 90 standard cubic centimeters per minute (sccm) of difluoromethane ($CH_2F_2$), approximately 40 sccm of tetrafluoromethane ($CF_4$), approximately 27 sccm of oxygen ($O_2$) and approximately 200 sccm of nitrogen ($N_2$) for the SOI layer.

A third aspect of the invention provides a method of opening a hard mask and a silicon-on-insulator (SOI) substrate, the method comprising the steps of: providing a stack including an anti-reflective coating (ARC) layer, a silicon dioxide ($SiO_2$) based hard mask layer, a silicon nitride pad layer, a silicon dioxide ($SiO_2$) pad layer and the SOI substrate, wherein the SOI substrate includes a silicon-on-insulator (SOI) layer and a buried silicon dioxide ($SiO_2$) layer; patterning a photoresist over the stack; and in a single process chamber: opening the ARC layer; etching the silicon dioxide ($SiO_2$) based hard mask layer; etching the silicon nitride pad layer; etching the silicon dioxide ($SiO_2$) pad layer; and etching the SOI substrate using an chemistry including: approximately 90 standard cubic centimeters per minute (sccm) of difluoromethane ($CH_2F_2$), approximately 40 sccm of tetrafluoromethane ($CF_4$), approximately 27 sccm of oxygen ($O_2$) and approximately 200 sccm of nitrogen ($N_2$) for the SOI layer, and approximately 10-30 sccm oxygen ($O_2$), 10-40 sccm hexafluorobutadiene ($C_4F_6$) and 900-1200 sccm argon (Ar) for the buried silicon dioxide ($SiO_2$) layer.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
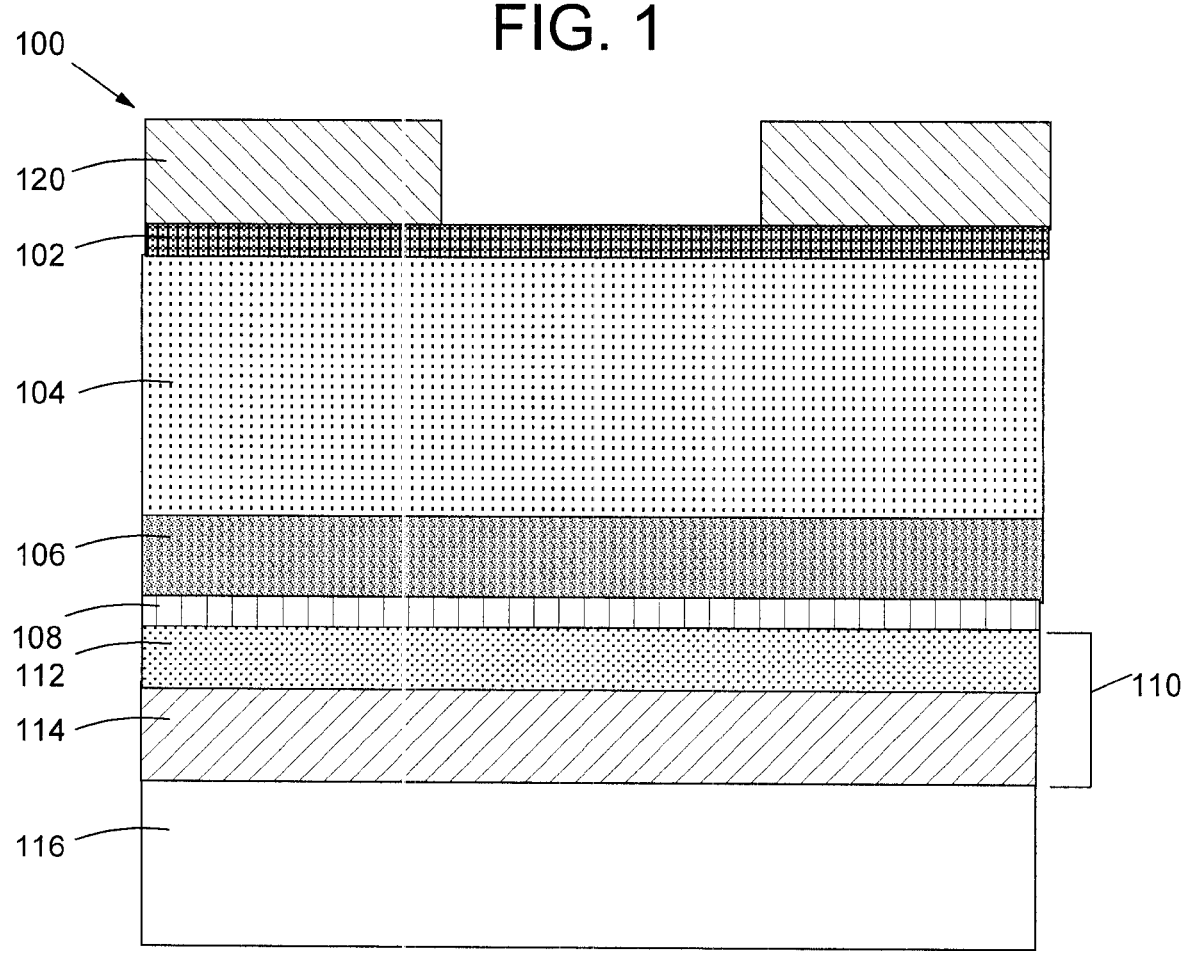
FIGS. 1-6 show one embodiment of an etching method according to the invention.

Turning to the drawings, FIG. 1 shows a first step of one embodiment of a method of opening a hard mask and a silicon-on-insulator (SOI) substrate according to the invention. In a first step, a stack 100 is provided including an anti-reflective coating (ARC) layer 102, a silicon dioxide ($SiO_2$) based hard mask layer 104, a silicon nitride pad layer 106, a silicon dioxide ($SiO_2$) pad layer 108 and a silicon-on-insulator (SOI) substrate 110. SOI substrate 110 includes a silicon-on-insulator (SOI) layer 112 and a buried silicon dioxide ($SiO_2$) (BOX) layer 114. SOI substrate 110 is positioned over a bulk silicon substrate 116. As also shown in FIG. 1, the first step may also include patterning a photoresist 120 over stack 100 in any now known or later developed fashion.

Figure 2:
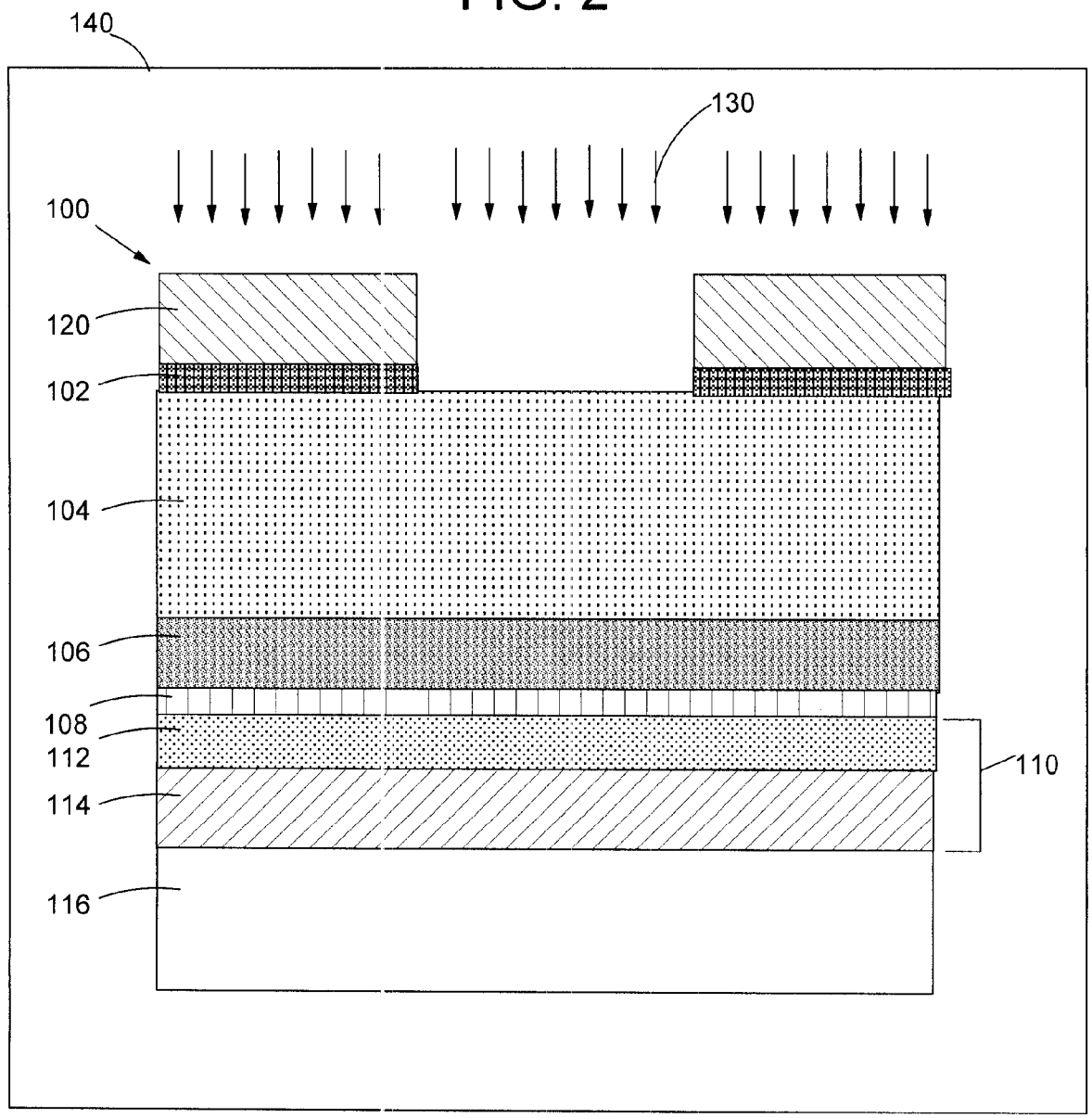

In a second step, shown in FIG. 2, ARC layer 102 is opened in any now known or later developed fashion. For example, ARC layer 102 may be opened by performing an etch 130 including approximately 100-200 standard cubic centimeters per minute (sccm) of tetrafluoromethane ($CF_4$) with a power of 400-700 Watts and a pressure of 50-150 milli-Torr.

Figure 3:
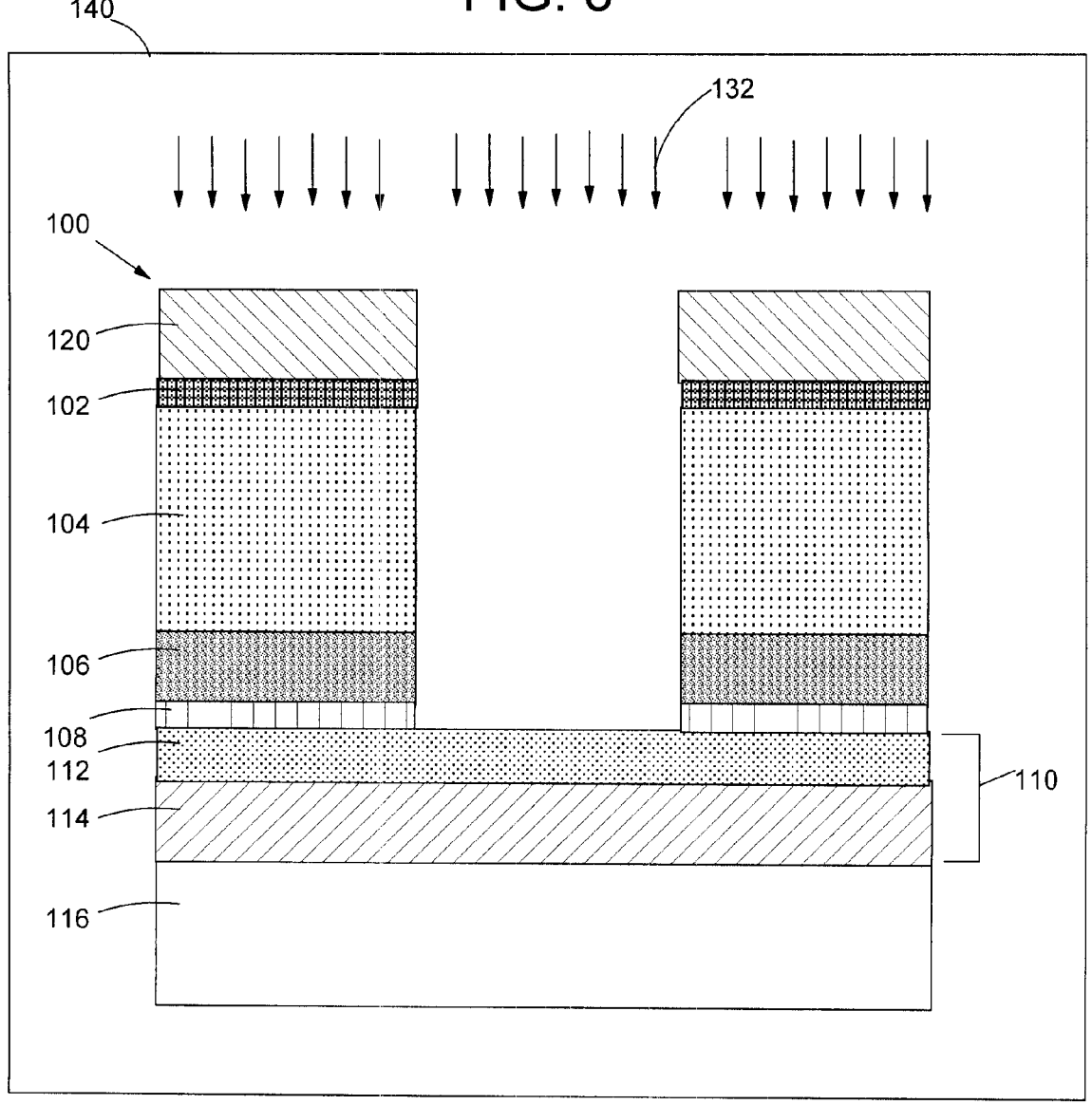

In a third step, shown in FIG. 3, silicon dioxide ($SiO_2$) based hard mask layer 104 (hereinafter "hard mask layer 104"), silicon nitride pad layer 106 and silicon dioxide ($SiO_2$) pad layer 108 are etched 132 in any now known or later developed fashion. Hard mask layer 104 may include, for, boro-silicate glass (BSG) or other silicon dioxide ($SiO_2$) based hard mask material such as undoped silicon dioxide ($SiO_2$) deposited by any suitable processes such as chemical vapor deposition (CVD) including low pressure CVD, plasma enhanced CVD, or high density plasma CVD. As known in the art, each material may require a different etch chemistry. For example, etch 132 may include 10-30 sccm oxygen ($O_2$), 10-40 sccm hexafluorobutadiene ($C_4F_6$) and 900-1200 sccm argon (Ar) for hard mask layer 104, and may include 50-100 sccm difluoromethane ($CH_2F_2$), 10-40 sccm oxygen ($O_2$), 40-80 sccm tetrafluoromethane ($CF_4$) and 400-1000 sccm argon (Ar) for pad layers 106 and 108.

Figure 4:
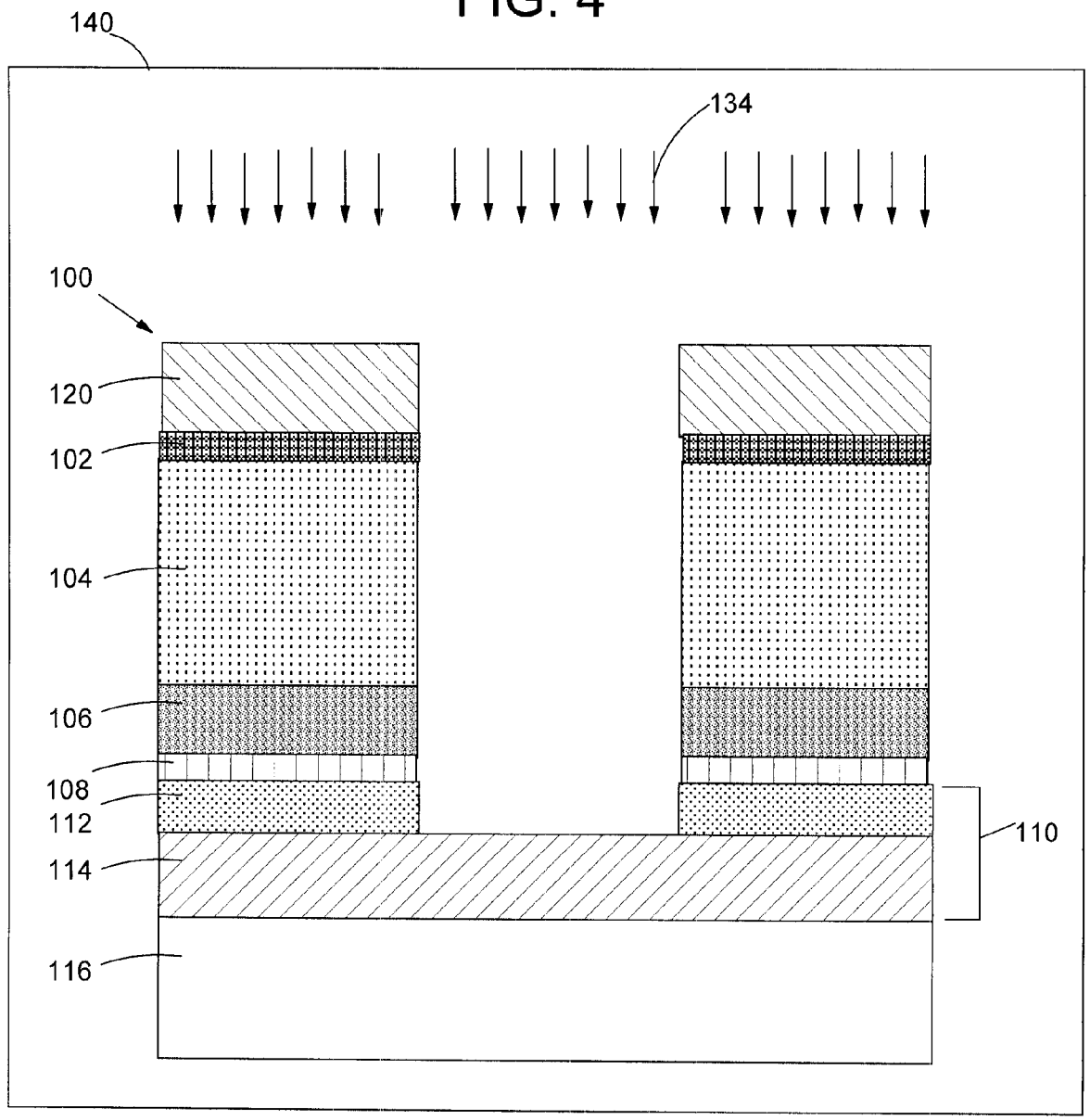
Figure 5:
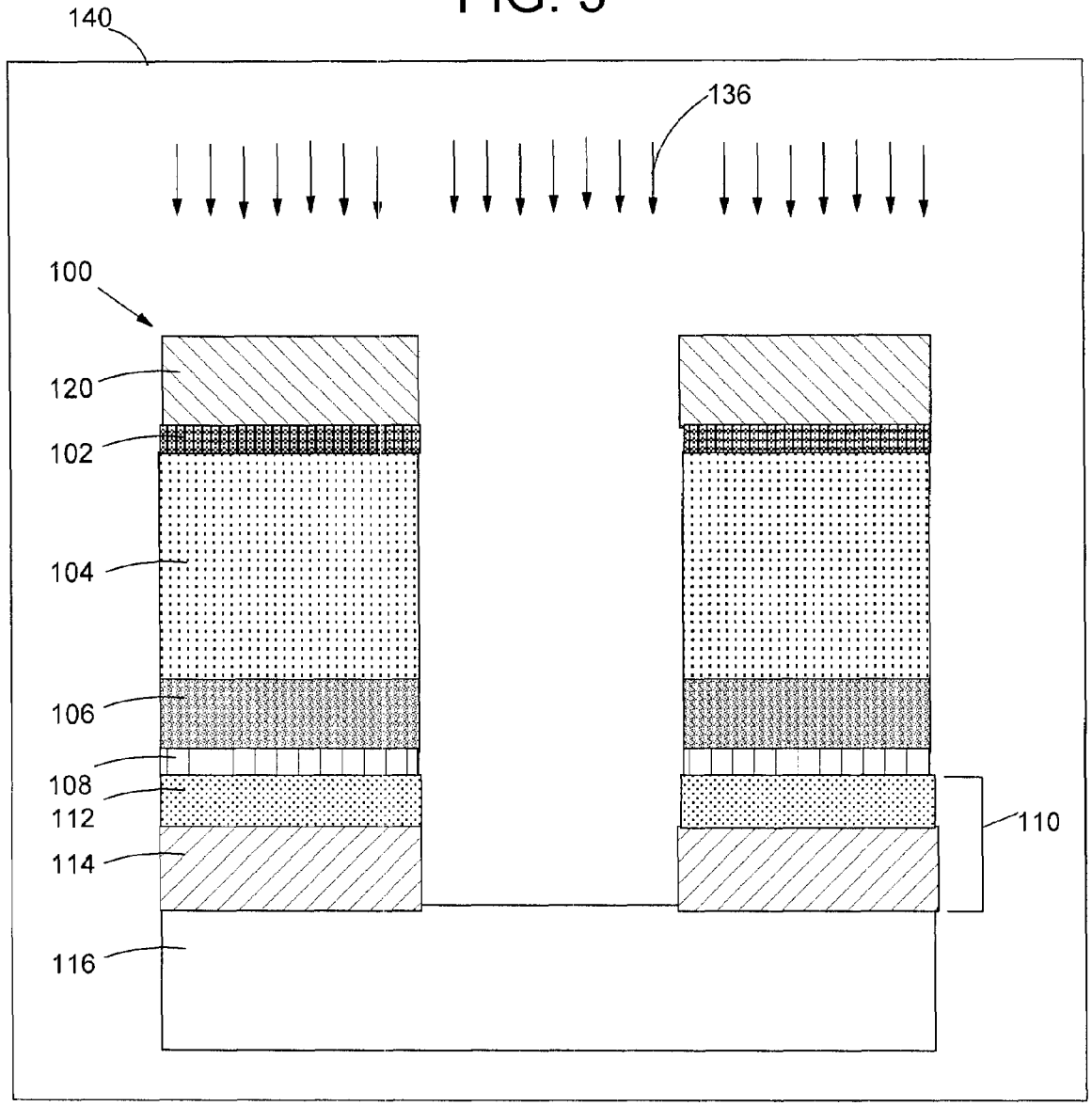

In a fourth step, shown in FIGS. 4-5, SOI substrate 110 is etched 134 and 136. Etching 134 etches through silicon-on-insulator (SOI) layer 112 (FIG. 4). In one embodiment of the invention, etching 134 uses an etch chemistry including nitrogen ($N_2$) rather than the typical carbon monoxide based chemistry. In one embodiment, the etch chemistry includes approximately 80-100 sccm of difluoromethane ($CH_2F_2$), approximately 35-45 sccm of tetrafluoromethane ($CF_4$), approximatey 25-30 sccm of oxygen ($O_2$) and approximately 180-220 sccm of nitrogen ($N_2$). More specifically, the etching chemistry may include: approximately 90 sccm of difluoromethane ($CH_2F_2$), approximately 40 sccm of tetrafluoromethane ($CF_4$), approximately 27 sccm of oxygen ($O_2$) and approximately 200 sccm of nitrogen ($N_2$). Etching 136 etches through BOX layer 114 (FIG. 5). In one embodiment, the etch chemistry may include using approximately 10-30 sccm oxygen ($O_2$), 10-40 sccm hexafluorobutadiene ($C_4F_6$) and 900-1200 sccm argon (Ar).

The above-described etching chemistry allows etchings, 130, 132, 134 and 136 to occur in a single process chamber 140 (FIGS. 2-6).

Figure 6:
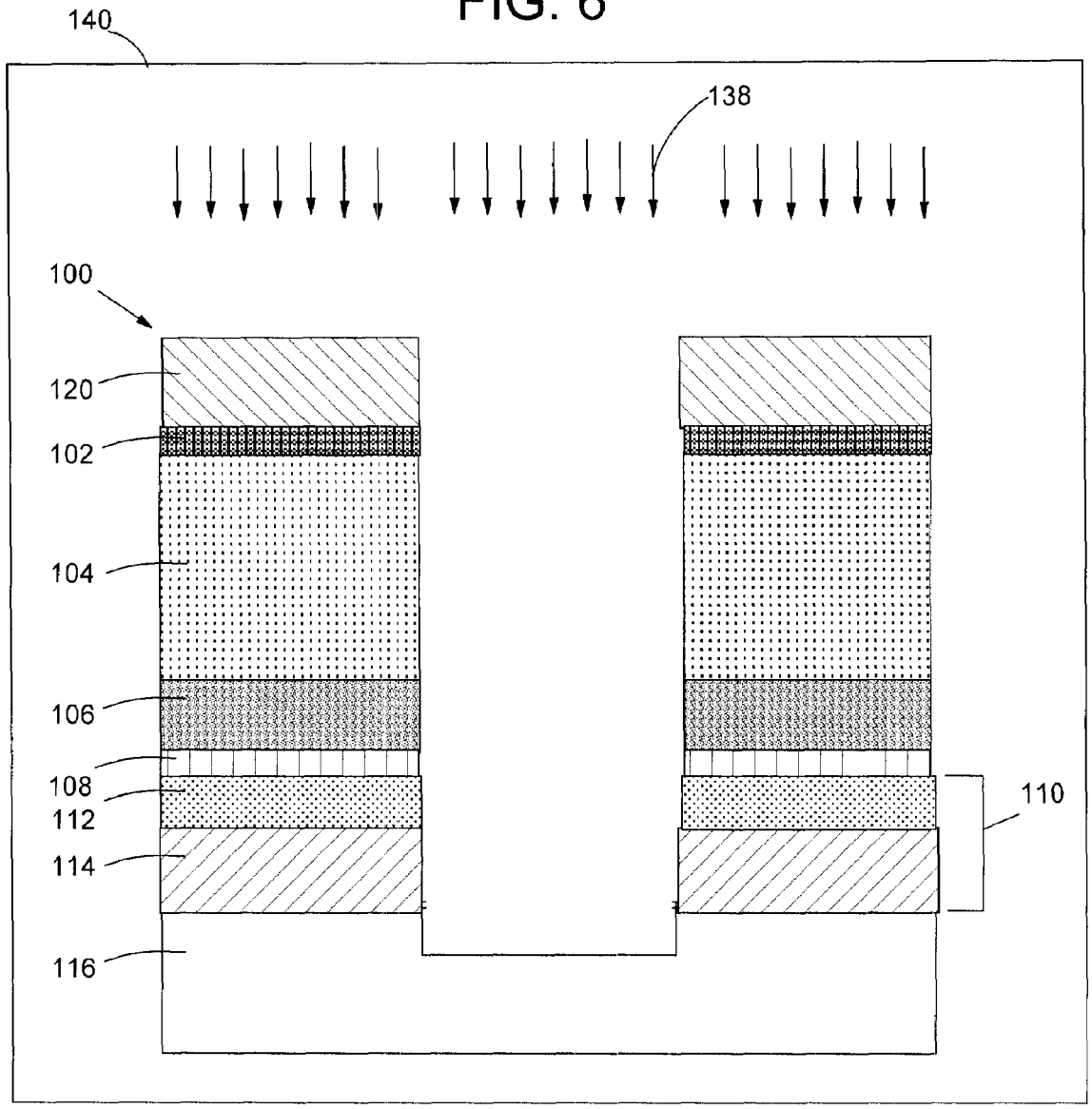

FIG. 6 shows an alternative step in which SOI substrate 110 etching further includes an overetch step 138 into bulk silicon substrate 116 under SOI substrate 110. In one embodiment, the overetch step 138 chemistry may include using approximately 80-100 sccm of difluoromethane ($CH_2F_2$), approximately 35-45 sccm of tetrafluoromethane ($CF_4$), approximately 25-30 sccm of oxygen ($O_2$) and approximately 180-220 sccm of nitrogen ($N_2$).

The above-described embodiments allow etching hard mask layer 104, silicon nitride pad layer 106, silicon dioxide ($SiO_2$) pad layer 108, silicon-on-insulator (SOI) substrate 110, and overetching into bulk silicon substrate in a single process chamber 140 by using a photoresist as a single mask which decreases equipment expense and quickens processing. In addition, the above-described embodiments result in a more uniform SOI substrate 110 opening across an entire wafer, reduce consumption of photoresist 120, and/or improve profile control.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of opening a hard mask and a silicon-on-insulator (SOI) substrate, the method comprising the steps of:
   patterning a photoresist over a stack including an anti-reflective coating (ARC) layer, a silicon dioxide ($SiO_2$) based hard mask layer, a silicon nitride pad layer, a silicon dioxide ($SiO_2$) pad layer and the SOI substrate, wherein the SOI substrate includes a silicon-on-insulator (SOI) layer and a buried silicon dioxide ($SiO_2$) layer; and
   in a single process chamber:
     opening the ARC layer;
     etching the silicon dioxide ($SiO_2$) based hard mask layer;
     etching the silicon nitride pad layer;
     etching the silicon dioxide ($SiO_2$) pad layer; and
     etching the SOI substrate, wherein the etch chemistry for etching the SOI substrate includes:
       using approximately 80-100 standard cubic centimeters per minute (sccm) of difluoromethane ($CH_2F_2$), approximately 35-45 sccm of tetrafluoromethane ($CF_4$) approximately 25-30 sccm of oxygen ($O_2$) and approximately 180-220 sccm of nitrogen ($N_2$) for the SOI layer; and
       using approximately 10-30 sccm oxygen ($O_2$) 10-40 sccm hexafluorobutadiene ($C_4F_6$) and 900-1200 sccm argon (Ar) for the buried silicon dioxide ($SiO_2$) layer.

2. The method of claim 1, wherein the etch chemistry for the SOI layer includes: approximately 90 sccm of difluoromethane ($CH_2F_2$), approximately 40 sccm of tetrafluoromethane ($CF_4$), approximately 27 sccm of oxygen ($O_2$) and approximately 200 sccm of nitrogen ($N_2$).

3. The method of claim 1, wherein the SOI substrate etching step further includes overetching into a bulk silicon substrate under the SOI substrate.

4. The method of claim 3, wherein the overetching step includes using approximately 80-100 standard cubic centimeters per minute (sccm) of difluoromethane ($CH_2F_2$), approximately 35-45 sccm of tetrafluoromethane ($CF_4$), approximately 25-30 sccm of oxygen ($O_2$) and approximately 180-220 sccm of nitrogen ($N_2$).

5. The method of claim 1, wherein the ARC layer opening step includes etching using approximately 100-200 standard cubic centimeters per minute (sccm) of tetrafluoromethane ($CF_4$) with a power of 400-700 Watts and a pressure of 50-150 milli-Torr.

6. The method of claim 1, wherein the silicon dioxide ($SiO_2$) based hard mask layer etching step includes using 10-30 standard cubic centimeters per minute (sccm) oxygen ($O_2$), 10-40 sccm hexafluorobutadiene ($C_4F_6$) and 900-1200 sccm argon (Ar).

7. The method of claim 1, wherein the silicon nitride pad layer and the silicon dioxide ($SiO_2$) pad layer etching steps include using 50-100 standard cubic centimeters per minute (sccm) difluoromethane ($CH_2F_2$), 10-40 sccm oxygen ($O_2$), 40-80 sccm tetrafluoromethane ($CF_4$) and 400-1000 sccm argon (Ar).

8. A method of opening a hard mask and a silicon-on-insulator (SOI) substrate, the method comprising the steps of:

patterning a photoresist over a stack including an anti-reflective coating (ARC) layer, a silicon dioxide ($SiO_2$) based hard mask layer, a silicon nitride pad layer, a silicon dioxide ($SiO_2$) pad layer and the SOI substrate, wherein the SOI substrate includes a silicon-on-insulator (SOI) layer and a buried silicon dioxide ($SiO_2$) layer; and in a single process chamber:
opening the ARC layer;
etching the silicon dioxide ($SiO_2$) based hard mask layer;
etching the silicon nitride pad layer;
etching the silicon dioxide ($SiO_2$) pad layer; and
etching the SOI substrate using an etch chemistry including:
approximately 90 standard cubic centimeters per minute (sccm) of difluoromethane ($CH_2F_2$), approximately 40 sccm of tetrafluoromethane ($CF_4$), approximately 27 sccm of oxygen ($O_2$) and approximately 200 sccm of nitrogen ($N_2$) for the SOI layer.

9. The method of claim 8, wherein the SOI substrate etching step further includes using approximately 10-30 sccm oxygen ($O_2$), 10-40 sccm hexafluorobutadiene ($C_4F_6$) and 900-1200 sccm argon (Ar) for the buried silicon dioxide ($SiO_2$) layer.

10. The method of claim 8, wherein the SOI substrate etching step further includes overetching into a bulk silicon substrate under the SOI substrate.

11. The method of claim 10, wherein the overetching step includes using approximately 80-100 sccm of difluoromethane ($CH_2F_2$), approximately 35-45 sccm of tetrafluoromethane ($CF_4$), approximately 25-30 sccm of oxygen ($O_2$) and approximately 180-220 sccm of nitrogen ($N_2$).

12. The method of claim 8, wherein the ARC layer opening step includes etching using approximately 100-200 sccm of tetrafluoromethane ($CF_4$) with a power of 400-700 Watts and a pressure of 50-150 milli-Torr.

13. The method of claim 8, wherein the silicon dioxide ($SiO_2$) based hard mask layer etching step includes using 10-30 sccm oxygen ($O_2$), 10-40 sccm hexafluorobutadiene ($C_4F_6$) and 900-1200 sccm argon (Ar).

14. The method of claim 8, wherein the silicon nitride pad layer and the silicon dioxide ($SiO_2$) pad layer etching steps include using 50-100 sccm difluoromethane ($CH_2F_2$), 10-40 sccm oxygen ($O_2$), 40-80 sccm tetrafluoromethane ($CF_4$) and 400-1000 sccm argon (Ar).

15. A method of opening a hard mask and a silicon-on-insulator (SOI) substrate, the method comprising the steps of:

providing a stack including an anti-reflective coating (ARC) layer, a silicon dioxide ($SiO_2$) based hard mask layer, a silicon nitride pad layer, a silicon dioxide ($SiO_2$) pad layer and the SOI substrate, wherein the SOI substrate includes a silicon-on-insulator (SOI) layer and a buried silicon dioxide ($SiO_2$) layer;

patterning a photoresist over the stack; and in a single process chamber:
opening the ARC layer;
etching the silicon dioxide ($SiO_2$) based hard mask layer;
etching the silicon nitride pad layer;
etching the silicon dioxide ($SiO_2$) pad layer; and
etching the SOI substrate using an etch chemistry including:
approximately 90 standard cubic centimeters per minute (sccm) of difluoromethane ($CH_2F_2$), approximately 40 sccm of tetrafluoromethane ($CF_4$), approximately 27 sccm of oxygen ($O_2$) and approximately 200 sccm of nitrogen ($N_2$) for the SOI layer, and
approximately 10-30 sccm oxygen ($O_2$), 10-40 sccm hexafluorobutadiene ($C_4F_6$) and 900-1200 sccm argon (Ar) for the buried silicon dioxide ($SiO_2$) layer.

16. The method of claim 15, wherein the SOI substrate etching step further includes overetching into a bulk silicon substrate under the SOI substrate.

17. The method of claim 16, wherein the overetching step includes using approximately 80-100 sccm of difluoromethane ($CH_2F_2$), approximately 35-45 sccm of tetrafluoromethane ($CF_4$), approximately 25-30 sccm of oxygen ($O_2$) and approximately 180-220 sccm of nitrogen ($N_2$).

18. The method of claim 15, wherein the ARC layer opening step includes etching using approximately 100-200 sccm of tetrafluoromethane ($CF_4$) with a power of 400-700 Watts and a pressure of 50-150 milli-Torr.

19. The method of claim 15, wherein the silicon dioxide ($SiO_2$) based hard mask layer etching step includes using 10-30 sccm oxygen ($O_2$), 10-40 sccm hexafluorobutadiene ($C_4F_6$) and 900-1200 sccm argon (Ar), and the silicon nitride pad layer and the silicon dioxide ($SiO_2$) pad layer etching steps include using 50-100 sccm difluoromethane ($CH_2F_2$), 10-40 sccm oxygen ($O_2$), 40-80 sccm tetrafluoromethane ($CF_4$) and 400-1000 sccm argon (Ar).

* * * * *